United States Patent [19]
Bonyhard

[11] Patent Number: 5,737,156
[45] Date of Patent: Apr. 7, 1998

[54] BARBERPOLE MR SENSOR HAVING INTERLEAVED PERMANENT MAGNET AND MAGNETORESISTIVE SEGMENTS

[75] Inventor: Peter L Bonyhard, Edina, Minn.

[73] Assignee: Seagate Technology, Inc., Scotts Valley, Calif.

[21] Appl. No.: 667,276

[22] Filed: Jun. 20, 1996

Related U.S. Application Data

[63] Continuation of Ser. No. 402,548, Mar. 13, 1995, abandoned, which is a continuation of Ser. No. 148,890, Nov. 8, 1993, abandoned.

[51] Int. Cl.$^6$ ............................................. G11B 5/39
[52] U.S. Cl. ............................................. 360/113
[58] Field of Search ............... 360/113; 324/252, 324/207.21; 338/32 R

[56] References Cited

U.S. PATENT DOCUMENTS

| | | | |
|---|---|---|---|
| 4,972,284 | 11/1990 | Smith et al. | 360/113 |
| 5,055,786 | 10/1991 | Wakatuski et al. | 324/252 |
| 5,402,292 | 3/1995 | Komoda et al. | 360/113 |
| 5,412,524 | 5/1995 | Naguta et al. | 360/113 |

FOREIGN PATENT DOCUMENTS

| | | | |
|---|---|---|---|
| 0551603 | 7/1993 | European Pat. Off. | 360/113 |
| 57-88521 | 6/1982 | Japan | 360/113 |
| 57-208624 | 12/1982 | Japan | 360/113 |
| 60-119618 | 6/1985 | Japan | 360/113 |
| 62-66413 | 3/1987 | Japan | 360/113 |
| 63-196817 | 8/1988 | Japan | 324/252 |
| 0849295 | 7/1981 | Russian Federation | 360/113 |

*Primary Examiner*—Stuart S. Levy
*Assistant Examiner*—William J. Klimowicz
*Attorney, Agent, or Firm*—Kinney & Lange, P.A.

[57] ABSTRACT

A barberpole magnetoresistive (MR) sensor has a series of permanent magnet strips interleaved with a series of magnetoresistive strips. Conductive barberpole strips are canted across the sensor and connect one magnetoresistive strip, over a permanent magnet strip, to another magnetoresistive strip. The permanent magnet strips help to provide a uniform magnetic field throughout the sensor, thereby making the sensor more immune to harm from an external magnetic field and more likely to reset into a single magnetic domain oriented as desired if an external magnetic field should cause the sensor to fracture into multiple magnetic domains.

19 Claims, 10 Drawing Sheets

BARBERPOLE MR SENSOR HAVING INTERLEAVED PERMANENT MAGNET AND MAGNETORESISTIVE SEGMENTS

This is a continuation of abandoned application Ser. No. 08/402,548, which was filed Mar. 13, 1995 as a continuation of application Ser. No. 08/148,890, which was filed Nov. 8, 1993 and is now abandoned

BACKGROUND OF THE INVENTION

The present invention is a magnetoresistive (MR) sensor. More specifically, the present invention is a barberpole MR sensor having magnetoresistive sections interleaved with permanent magnet sections.

MR sensors are used to detect magnetic flux levels stored on magnetic media. In an MR sensor, the resistance of the sensor varies with the magnitude of the flux passing through the sensor. Typically, a constant current is passed through the sensor and the magnitude of the flux passing through the sensor is represented by a change in the voltage across the sensor, which of course is a function of the resistance of the sensor. Likewise, a constant voltage source can be applied to the MR sensor, in which case the magnetic flux magnitude is represented by a change in the current through the sensor.

In an MR sensor, maximum sensitivity is achieved when a static magnetization vector is applied at 45° with respect to the direction of current flow through the MR sensor. This relationship exists because the output voltage of the MR sensor for any given input current is proportional to $COS^2\theta$, where $\theta$ is the angle between the static magnetization vector and the current vector. At 45°, this function provides maximum equal and opposite changes in output for corresponding equal and opposite deviations in magnetic flux.

In one typical configuration, an MR sensor is comprised of a layer of magnetoresistive material (typically Permalloy), which is the sensing portion of the MR sensor, together with first and second contacts positioned at each side of the magnetoresistive material. Current flows from the first contact through the material to the second contact. In this configuration, a static magnetization field is applied to hold the magnetization at a 45° angle with respect to the flow of current through the magnetoresistive material. The static magnetic field can be applied via an external magnetic field, a permanent magnet built into the sensor structure, coupled magnetic films, soft adjacent layers, or current carrying paths built into the sensor structure.

In another typical configuration, referred to as the canted current configuration, the magnetization vector lies along a line between the first and second contacts such that the current flows through the magnetoresistive material at 45° with respect to the line. To achieve this, the contacts are canted, or slanted, across the magnetoresistive material at a 45° angle with respect to the line. In addition, the resistance of the contacts is significantly less than the resistance of the magnetoresistive material.

In the canted current configuration, the current flows out of the first canted contact perpendicular to the boundary between the first contact and the magnetoresistive layer. The current then flows across the magnetoresistive layer at the desired 45° angle and encounters the second contact perpendicular to the boundary between the second contact and the magnetoresistive layer, which again is 45° with respect to the line connecting the first and second contacts. To enhance the stability of the device, permanent magnet material may be positioned proximate the contacts such that the permanent magnet material provides a magnetic field H in the magnetoresistive layer along a line between the contacts. In addition, if Permalloy is formed into a long narrow strip, the magnetization vector M will naturally point along the long axis of the strip.

One limitation of the canted current configuration is that the width of the detection region of the sensor is limited by the height of the sensor. For example, assume that the current is flowing in a sensor from right to left, and the right contact is canted at 45°, with the lower portion of the right contact more to the left than the upper portion. In this configuration, the current will tend to flow from the bottom of the magnetoresistive material to the top of the material. Accordingly, at 45° the maximum width of the detection region equals √2 times the magnetoresistive layer height.

In some applications, it is desired to have a wider detection area. One solution has been to provide the MR sensor with barberpole strips as shown in FIG. 1. Barberpole strips 14a–14c are highly conductive regions which are positioned over magnetoresistive layer 12 at 45° angles such that barberpole strips 14 are parallel to the boundaries between magnetoresistive layer 12 and canted contacts 16a and 16b. In the previous example, the current flows from the right canted contact, through the magnetoresistive layer at 45°, and into the left canted contact. In barberpole sensor 10 of FIG. 1, as the current flows from right to left, and therefore upward at 45° (arrows in FIG. 1) with respect to a line between canted contacts 16a and 16b, the current intersects barberpoles 14a–14c. When the current intersects the barberpoles, the barberpoles redistribute the current evenly such that when the current leaves the right edge of each barberpole, it is oriented similarly to how it was oriented when it left the canted contact. In general, the number of barberpoles required is a function of the desired width of the MR sensor, with a wider sensor requiring more barberpoles.

In applications where an MR sensor is to be used with recording tape, the MR sensor must be relatively wide. Accordingly, a large number of barberpole strips are required. One problem with wide MR sensors is that it becomes difficult to maintain a static magnetization along the MR sensor. In the presence of a disturbing stray magnetic field, the magnetoresistive layer can fracture into separate magnetic domains. This can cause Barkhausen noise. Without a stabilizing field, the MR element becomes less immune to the effects of external magnetic fields. If an external magnetic field should cause a single magnetic domain to fracture into multiple domains, the static stabilizing field may not be strong enough to overcome the fractured domains and reset the magnetoresistive layer into a single domain. Accordingly, a wide barberpole sensor is more likely to be disrupted by external magnetic fields and is less likely to reset itself to a single domain after being disrupted. Therefore, barberpole MR sensors used in tape applications could be less stable than barberpole MR sensors used in other applications where the detection region is narrower.

SUMMARY OF THE INVENTION

The present invention is a barberpole magnetoresistive (MR) sensor. The sensor includes a series of magnetoresistive strips. Interleaved with the series of magnetoresistive strips is a series of permanent magnet strips. Each permanent magnet strip is adjacent a left magnetoresistive strip and a right magnetoresistive strip of the series of magnetoresistive strips. A series of barberpole strips are canted across the series of permanent magnet strips, with each barberpole strip connecting the left magnetoresistive strip to the right magnetoresistive strip of the respective permanent magnet strip.

3

Since the barberpole strips are more conductive than the permanent magnet strips, the barberpole strips carry the current over the permanent magnet strips. The barberpole strips and the permanent magnet strips also help ensure that the current does not flow in undesired areas of the magnetoresistive strips. Also, as in the prior art, the barberpole strips allow the current to flow at a 45° angle with respect to the magnetization vector.

The permanent magnet strips maintain a sufficiently strong uniform stabilizing field along the MR sensor. Since a uniform field is maintained across the sensor, the sensor is less likely to break up into multiple domains. In addition, if a strong external magnetic field should be applied and the sensor does break up into multiple domains, the series of permanent magnetic strips greatly increases the likelihood that each strip of magnetoresistive will be reset into a single domain. Accordingly, the barberpole sensor of the present invention is more stable than barberpole MR sensors of the prior art.

DETAILED DESCRIPTION OF THE PREFERRED EMBODIMENTS

Figure 1:
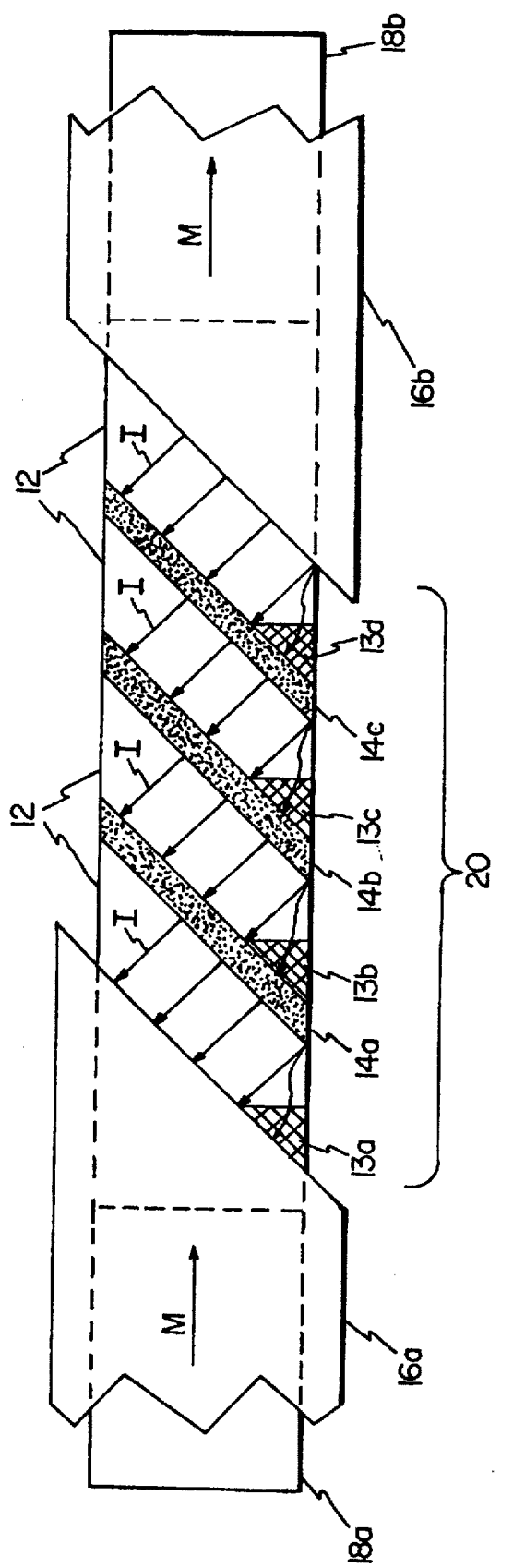
FIG. 1 shows a barberpole magnetoresistive (MR) sensor of the prior art.

FIG. 1 shows barberpole magnetoresistive (MR) sensor 10 of the prior art. Sensor 10 is comprised of a magnetoresistive region 12, which is formed of Permalloy, barberpoles 14a–14c formed on the region 12, contacts 16a and 16b, and permanent magnets 18a and 18b at the ends of region 12.

In prior art sensor 10, a read current is applied to contact 16b. Since contact 16b has much lower resistance than sensor region 12, current will flow out of contact 16b perpendicular to the boundary between contact 16b and sensor region 12. Since contact 16b is canted at 45° with respect to the longitudinal axis of sensor 10, the current flows through sensor region 12 at 45° with respect to the longitudinal axis, as shown by the arrows I in region 12.

As the current flows through region 12, it flows from the bottom of region 12 toward the top of region 12 until it intersects barberpole 14c. Barberpole 14c, like contact 16b, is formed from a highly conductive material. Barberpole 14c redistributes the current along its left most boundary and the current reenters region 12 at 45° with respect to the longitudinal axis of sensor 10. Likewise, barberpoles 14b and 14a intercept and redistribute the current, allowing it to reenter region 12 at 45° with respect to the longitudinal axis. After the current has left barberpole 14a, it flows into current contact 16a and then to a read amplifier.

To achieve maximum sensitivity in an MR sensor, the current must flow at 45° with respect to a static magnetic field. In FIG. 1, permanent magnet regions 18a and 18b produce a static magnetic field across magnetoresistive region 12. The permanent magnet regions are not used in some prior art configurations because if Permalloy is formed into a long narrow strip, the magnetization vector M will naturally orient itself the long axis of the strip. The magnetization vector M is at 45° with respect to the flow of current because the current flow is maintained at 45° by contacts 16a and 16b and barberpoles 14a, 14b and 14c.

Sense region 20 represents the portion of sensor 10 which is used to detect magnetic flux levels stored on magnetic media. As magnetic media moves with respect to MR sensor 10, the flux transitions stored on the media will pass through sense region 20. As the flux entering region 20 varies, the resistance of magnetoresistive region 12 varies. If a constant current is passed through sensor 10, then the voltage present between contacts 16a and 16b will vary as a function of the magnetic flux passing through sense region 20. Likewise, if a constant voltage is applied to contact 16a and 16b, then the current flowing through sensor 10 will vary with the flux present at sense region 20.

When a barberpole MR sensor, such as that shown in FIG. 1, is to be used to read data from a hard disc surface, the width of sense region 20 is relatively small. Accordingly, very few barberpoles, if any, are required. However, in magnetic tape applications the track widths are much wider. Accordingly, sense region 20 must also be wider. Therefore, more barberpoles are required.

As sense region 20 is widened, the magnetic field produced by permanent magnet regions 18a and 18b becomes weaker at the center of magnetoresistive region 12. When the magnetic field becomes weaker, magnetoresistive region 12 is more likely to break into multiple magnetic domains when an external magnetic field is applied. In addition, when the external magnetic field is removed, the magnetic field produced by permanent magnets 18a and 18b may be insufficient to reset magnetoresistive region 20 into a single domain.

Another problem associated with prior art sensor 10 is that current does not tend to flow through triangular regions 13a–13d at 45° with respect to the magnetization vector M. The hypotenuse of each triangle 13a–13d provides a surface for receiving current, however there is no corresponding surface to the right of the triangles to send out the current at 45°. Accordingly, the current tends to flow into the triangular regions at an angle less than 45° with respect to M, thereby affecting the read sensitivity of sensor 10.

With respect to triangle 13a and canted current contact 16a, this problem is addressed in the George et al. U.S. patent application Ser. No. 07/936,185, "Improved Read Sensitivity MR Head Using Permanent Magnet Longitudinal Stabilization" and assigned to the same Assignee as the present application, which is incorporated herein by reference. While this patent application addresses the problem of a triangular region adjacent a canted contact, such as triangular region 13a, it does not directly address triangular regions adjacent barberpole strips, such as triangular regions 13b–13d.

Figure 2:
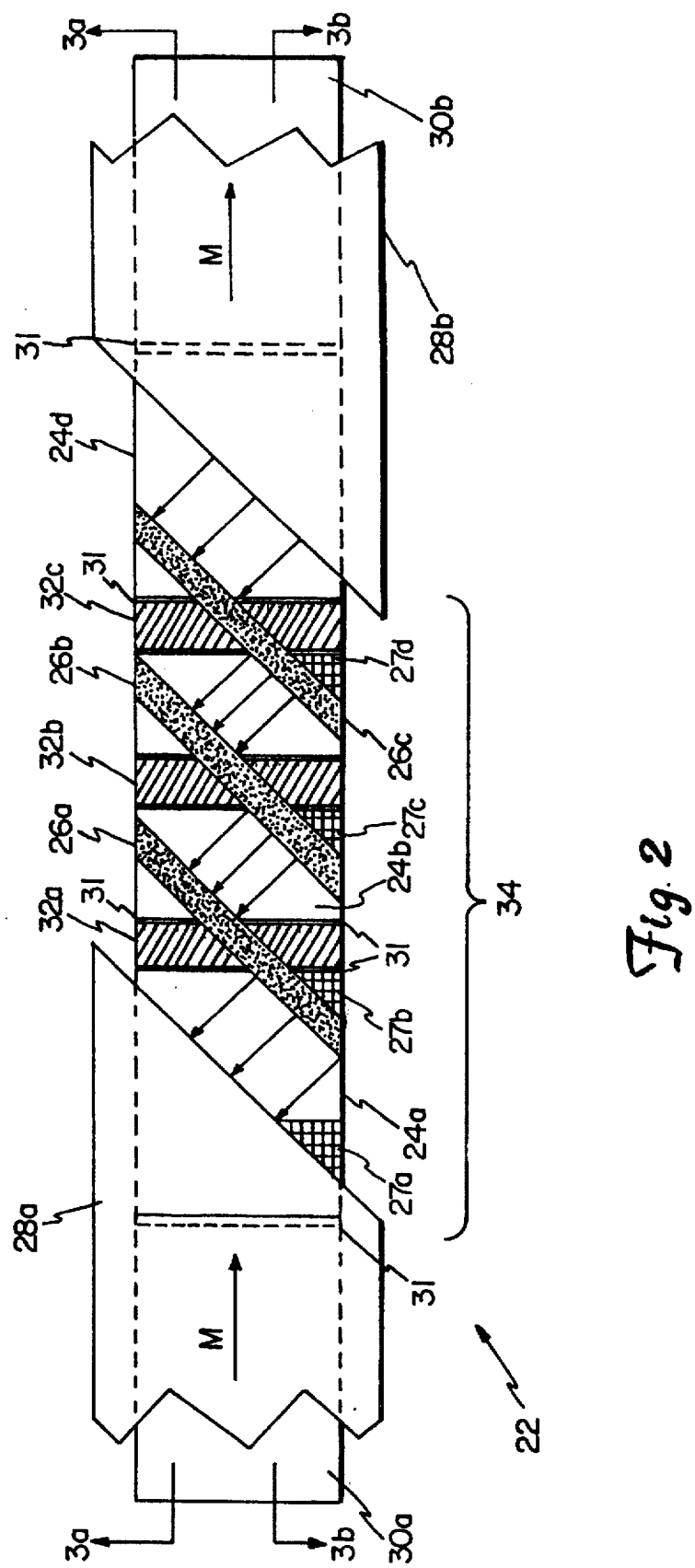
FIG. 2 shows the barberpole MR sensor of the present invention.

FIG. 2 shows the barberpole MR sensor 22 of the present invention. Sensor 22 is comprised of magnetoresistive regions 24a–24d, conductive barberpole strips 26a–26c, conductive contacts 28a and 28b, permanent magnet regions 30a and 30b, and permanent magnet strips 32a–32c. Gaps 31 separate the magnetoresistive regions from the permanent magnet regions.

Permanent magnet regions 30a and 30b supply a portion of the stabilizing field. Since contacts 28a and 28b are significantly more conductive than magnetoresistive regions 24a and 24d, respectively, the current flows into the magnetoresistive regions perpendicular to the boundary between the conductive contacts and the magnetoresistive regions. Since the conductive contacts are canted at 45° with respect to the magnetization vector M, the current flows through the magnetoresistive regions at 45° with respect to the magnetization vector.

As the current flows through the magnetoresistive regions at approximately 45°, it tends to approach the top portion of the magnetoresistive regions. Conductive barberpole strips 26a–26c intercept the current before it reaches the top of the magnetoresistive regions and redistribute the current into the next magnetoresistive region.

Sensor 22 is also provided with permanent magnet strips 32a–32c. These magnet strips help to maintain the stabilizing field throughout sensor 22. Compared to prior art sensor 10 of FIG. 1, which has a continuous magnetoresistive region 12, the magnetoresistive regions in sensor 22 are separated by the permanent magnet strips 32a–32c and gaps 31. Accordingly, conductive barberpole strips 26a–26d not only redistribute the current to keep it flowing at 45° with respect to the magnetization vector M, the barberpole strips also form current bridges to lift the current from one magnetoresistive region, over the magnetic strip and gaps, to the next magnetoresistive region. In the preferred embodiment shown in FIG. 2, the center of each barberpole strip is aligned with the center of each permanent magnet strip.

In addition, permanent magnet strips 32a–32c prevent current from flowing into triangular regions 27b–27d, respectively. Since current cannot flow into these triangular regions, all the current flows at 45° with respect to the magnetization vector M. Accordingly, the read sensitivity of sensor 22 is improved compared to prior art sensor 10 of FIG. 1. While current will still flow into triangular region 27a at an angle less than 45°, the effect is far less significant than in prior art sensor 10 because triangular region 27a comprises a relatively smaller portion of detection region 34.

While the preferred embodiment of the present invention is provided with gaps 31 between the permanent magnets and the magnetoresistive areas, these gaps are not necessary if the permanent magnet layer's resistivity is chosen such that it is much higher than that of the MR layer. Such a configuration is disclosed in U.S. Pat. No. 5,079,035, which is hereby incorporated by reference.

Figure 3A:
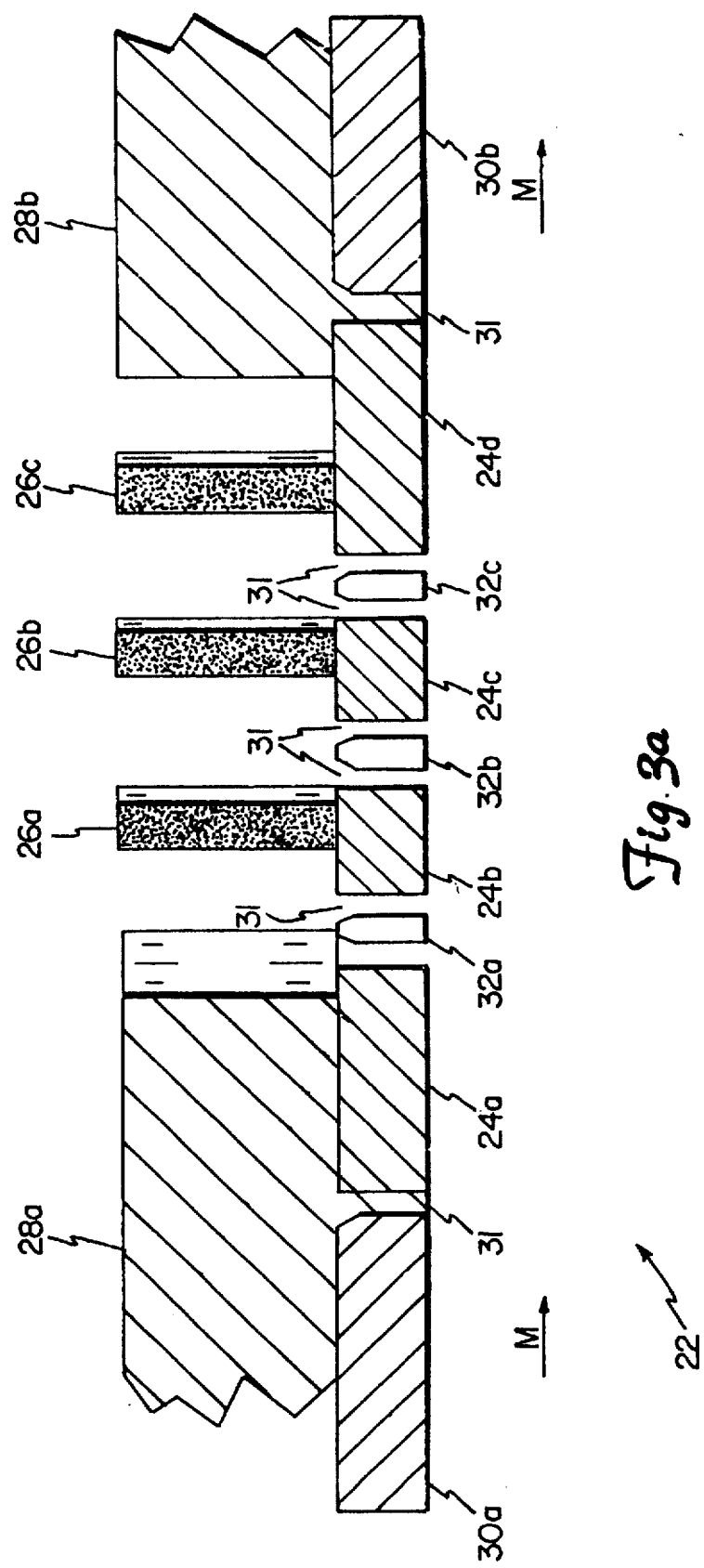
FIG. 3a is a cross-sectional view of the barberpole MR sensor of FIG. 2 taken along line 3a—3a of FIG. 2.
Figure 3B:
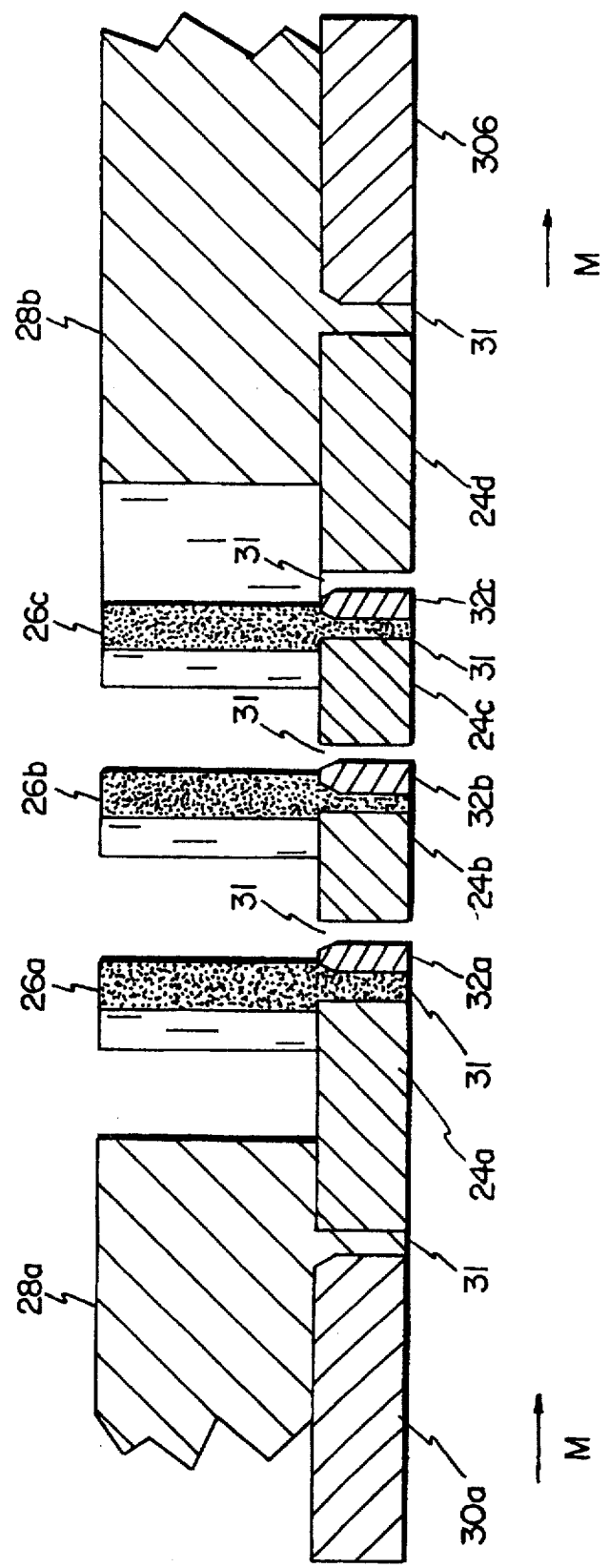
FIG. 3b is a cross-sectional view of the barberpole MR sensor of FIG. 2 taken along line 3b—3b of FIG. 2.

FIGS. 3a and 3b are sectional views taken along lines 3a—3a and 3b—3b, respectively, of FIG. 2. In FIGS. 3a and 3b, permanent magnet layers 30a and 30b provide a portion of the stabilizing field which is directed across the magnetoresistive regions. Conductive contacts 28a and 28b are formed from metallic material and provide contact points at which the sense current is applied. Magnetoresistive regions 24a–24d are separated by permanent magnet strips 32a–32c and gaps 31. Permanent magnet strips 32a–32c help to maintain the stabilizing field across the magnetoresistive regions.

In the preferred embodiment of the present invention, the magnetoresistive layers are preferably composed of an alloy comprised of $Ni_{82}Fe_{18}$. This alloy is also referred to as Permalloy. The permanent magnet layers are preferably formed of one of the following (or similar) alloys: $Co_{78}Pt_{22}$, $Co_{78}Cr_8Pt_{14}$, and $Co_{80}Sm_{20}$. The conductive contacts and barberpoles are preferably composed of a trilayer of Mo—Au—Mo, but many other conducting materials may be used.

A single-domain MR region having left and right edges at which the magnetization vector M is directed perpendicular to the left and right edges will exhibit a net external magnetic field at the left and right edges. The net external magnetic field may cause the MR region to become unstable, which can cause the edge areas of the MR region to fracture into multiple domains. When the MR region fractures into multiple domains, the net internal field of one domain will tend to cancel the net internal field of adjacent domains, such that the entire MR region will tend to exhibit no external magnetic field.

In order to maintain an MR element in a single domain state, it is known in the art to apply an external magnetic field to keep the magnetic dipoles of the crystalline alloy of the MR region aligned in the preferred direction. This is known in the art as longitudinal biasing. See U.S. Pat. No. 4,967,298 for a discussion of the problem of MR elements fracturing into multiple domains and previously known solutions.

It is theorized that the proper thickness of permanent magnet layer is that sufficient to produce the same magnetic flux as that present at the boundary of a saturated MR layer. Exceeding this amount of flux, while serving to keep the MR element in a single domain state, tends to decrease the sensitivity of the MR element to flux from the magnetic media.

Because the adjacent edges of the MR regions and the permanent magnet regions are the same length, the magnetic flux will be matched if:

$$M_r(PM)*t(PM)=M_r(MR)*t(MR),$$

where $M_r$ is the at-rest magnetization, PM represents the permanent magnet area, MR represents the magnetoresistive area, and t represents the thickness of the respective layers. Because the value of $M_r$ of the preferred permanent magnet materials is approximately equal to the value of $M_r$ of the preferred magnetoresistive material, the thickness of the two layers should be approximately equal. Conventionally, this thickness will be on the order of 300 Angstroms. As is well known in the art, the conductive contacts can be made much thicker, and are typically in the order of 1000 angstroms thick.

Since FIG. 3a is taken along section line 3a—3a of FIG. 2, the barberpole strips 26a–26c are shown above the magnetoresistive regions 24b–24d, respectively. In this view, the right edge of each barberpole strip is intercepting the current flowing through the magnetoresistive region. In FIG. 3b, which is taken along line 3b—3b of FIG. 2, each barberpole strip is shown bridging the gap between a magnet strip and a magnetoresistive region, with current flowing into each magnetoresistive region from the left edge of the respective barberpole strip. Because of permanent magnet strips 32a–32c, the stabilizing field is maintained at a stronger and more uniform magnitude across the magnetoresistive regions. Accordingly, the barberpole MR sensor of the present invention is much less likely to fracture into multiple domains.

Also, if a magnetic field strong enough to fracture the magnetoresistive regions into multiple magnetic domains, is applied to the sensor, the permanent magnetic strips enhance the probability that the magnetoresistive regions will each return to a single magnetic domain oriented longitudinally. Accordingly, the MR sensor of the present invention is more stable because it exhibits higher immunity to external magnetic fields and is more likely to recover from a strong magnetic field breaking the magnetoresistive regions into separate magnetic domains.

Figure 4:
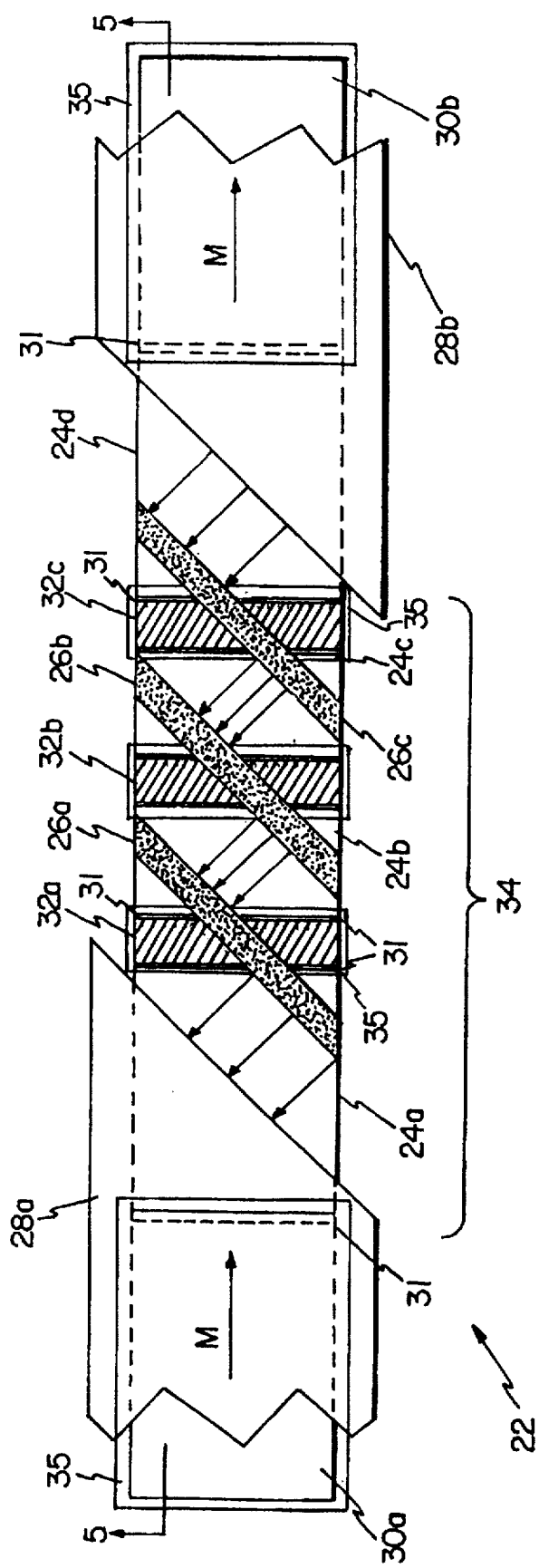
FIG. 4 shows an embodiment of the barberpole MR sensor of the present invention wherein gaps separate permanent magnet strips from adjacent magnetoresistive regions.
Figure 5:
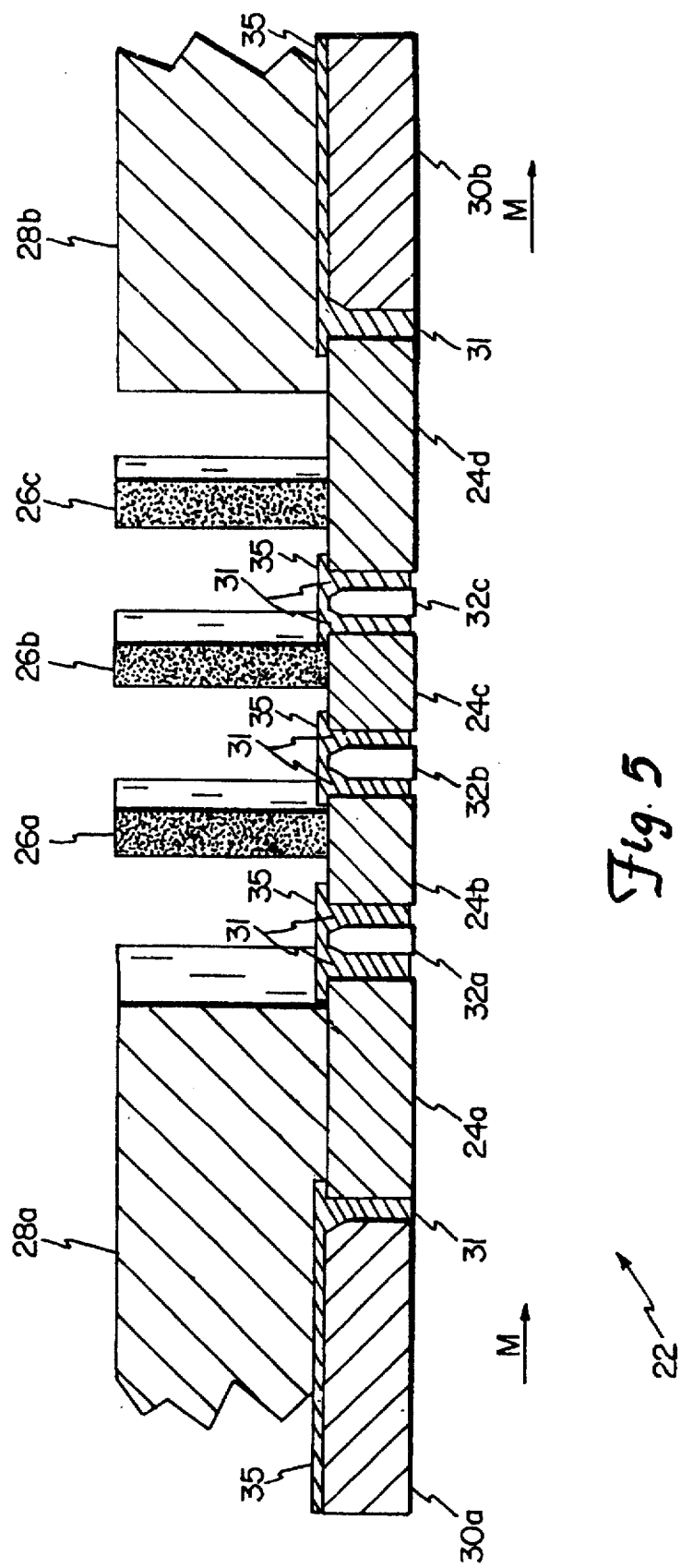
FIG. 5 is a cross-sectional view of the barberpole MR sensor of FIG. 4 taken along line 5—5 of FIG. 4.

FIG. 4 shows the MR barberpole sensor 22 of the present invention and further provided with spacer layers 35. Spacer layers 35 enhance the electrical isolation of the permanent magnet layers. FIG. 5 is taken along line 4—4 in FIG. 4 and shows the spacer layers 35 insulating the permanent magnet strips from adjacent MR regions. Spacer layers 35 are formed from an oxide, such as $Al_2O_3$.

The spacer layers 35 electrically isolate the MR regions and current carrying contacts from the permanent magnet areas, while also permitting the magnetic flux produced by the permanent magnet areas to hold the MR regions in a single domain state. By using spacing layers 35, all sense current is substantially confined to the MR regions.

FIGS. 6–9 illustrate a preferred process for forming the barberpole MR sensor 22 of the present invention. In these Figures, the process is shown specifically for MR regions 24a and 24b, and permanent magnet layers 30a and 32b, but the process is equally applicable to the remainder of sensor 22.

Figure 6:
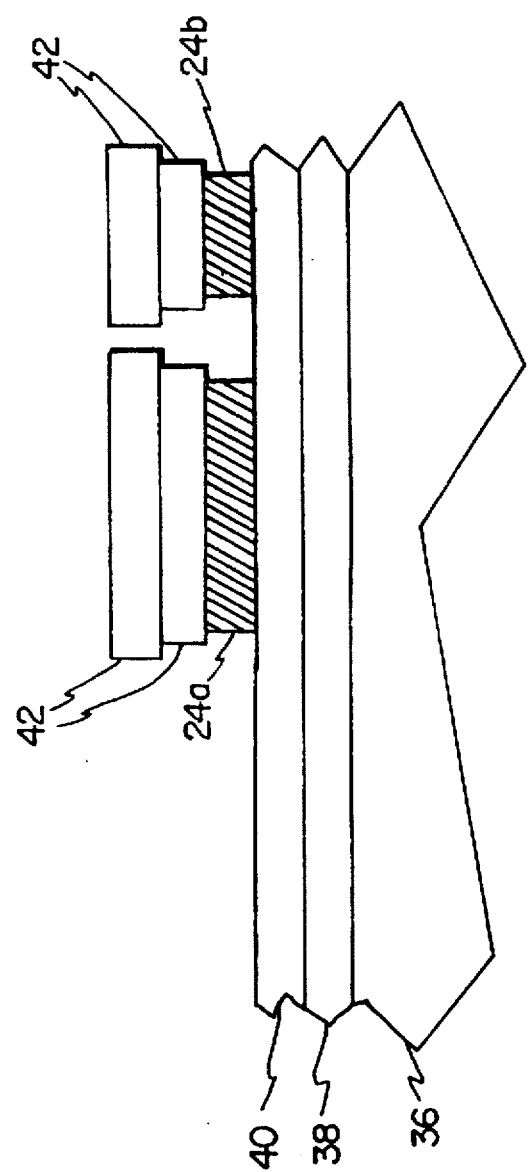
FIGS. 6–9 illustrate the process by which the barberpole MR sensor of FIG. 4 is formed.

In FIG. 6, MR sensor is formed upon a substrate comprising a base coat 36, a soft magnetic shield 38, and a half-gap oxide layer 40. Half-gap oxide layer 40 is conventionally composed of aluminum oxide. MR regions 24a and 24b are deposited and patterned upon the oxide layer 40 using a bi-layer lift off resist 42. A single layer approach may be used in an alternate method. MR layers 24a and 24b are then over etched using a chemical etchant such that the resulting MR element has a width slightly less than the overlying resist structure.

Figure 7:
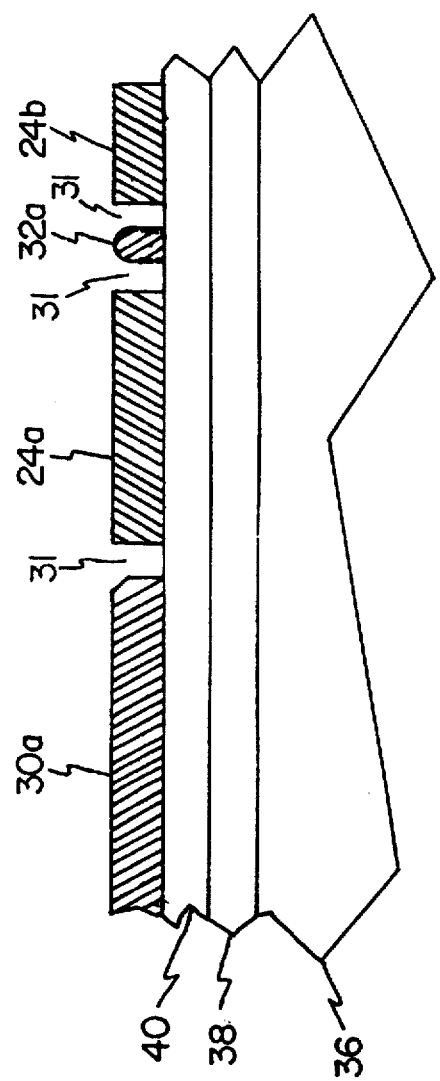

The permanent magnet layers 30 and 32 (see FIG. 5) are sputter deposited using resist layers 42 as a mask. After the magnet layers are deposited, resist layers 42 are removed by a lift off process. The resulting structure is shown in FIG. 7, where permanent magnet layers 30a and 32a are separated from adjacent MR layers by gaps 31.

Figure 8:
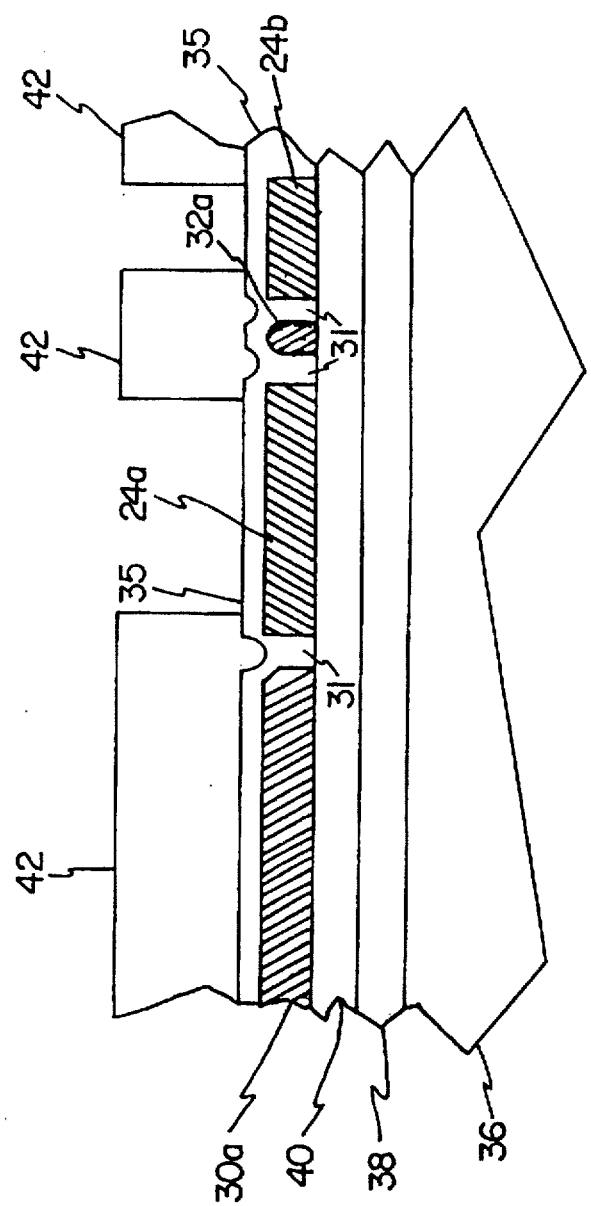

In FIG. 8, resist layer 42 has been removed, and spacer layer 35 has been deposited over the whole sensor. Another layer of resist 42 is patterned on the sensor in preparation for exposing most of the surface area of the MR layers. Using resist layer 42, spacer layer 35 is removed from most of the surface area of the MR layers, leaving the spacer layer over permanent magnet layers 30a and 32a, gaps 31, and the edges of MR layers 24a and 24b. Spacer layer 35 may be removed by a process such as selective chemical etching or ion milling.

Figure 9:
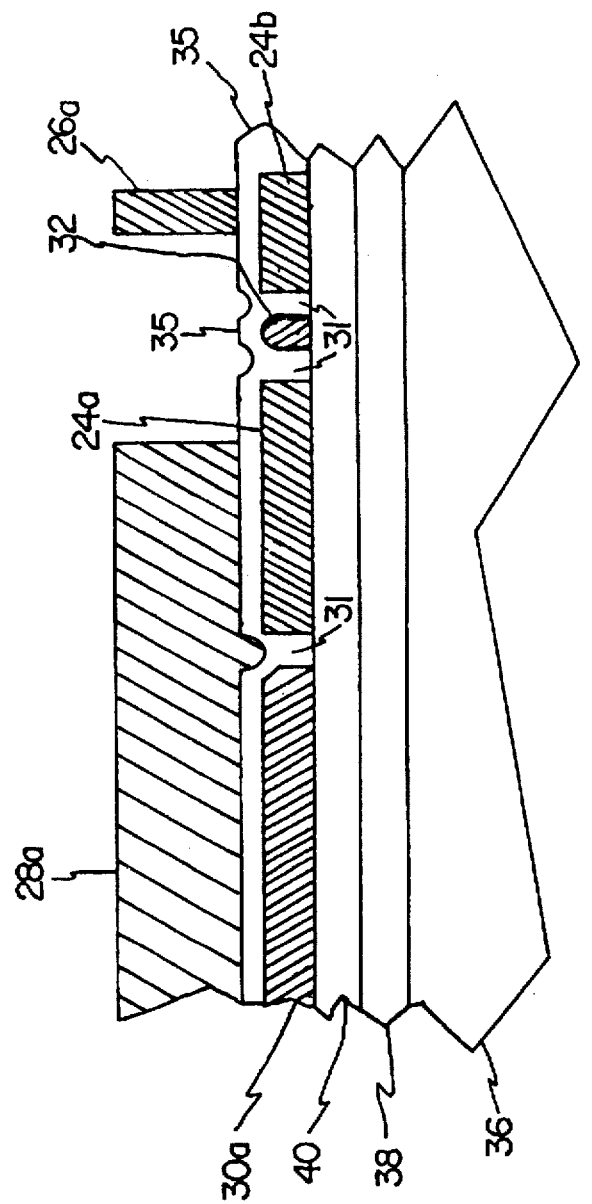

After spacer layer 35 has been removed, conductive contact 28a and barberpole strip 26a are deposited and patterned using a conventional process, with the resulting structure shown in FIG. 9. Accordingly, the MR barberpole sensor 22 shown in FIGS. 4 and 5 has been formed using the process shown in FIGS. 6–9. To form the sensor shown in FIGS. 2, 3a, and 3b, the steps of applying spacer layer 35 and patterning layer 35 with resist 42 are skipped.

The present invention provides an MR sensor suitable for reading wide tracks, such as those found in recording tape. When MR sensors are used in disc drives, the width of the track on the magnetic medium is extremely thin. Accordingly, the sense region of the sensor can be quite narrow. Since the sense region is narrow, few, if any, barberpoles are required to keep the current flowing at 45° with respect to the magnetization vector M. However, when an MR sensor is being used to read data from magnetic tape, the track on which the data is recorded is much wider. Accordingly, more barberpoles are required to maintain the current flow at 45°. In a prior art sensor, such as that shown in FIG. 1, as the sense region grows wider, the permanent magnets at the ends of the magnetoresistive region grow farther apart. Accordingly, the permanent magnets become less effective at maintaining the stabilizing field through out the magnetoresistive region. When the stabilizing field becomes weak, the MR sensor is prone to being disturbed by an external magnetic field, which can fracture the magnetoresistive region into multiple magnetic domains. In addition, since the stabilizing field is weak, the permanent magnets may not be powerful enough to restore the magnetoresistive region to a single magnetic domain.

In the present invention these problems are solved by interleaving permanent magnetic strips with the magnetoresistive material. The magnetic strips maintain the magnetization vector at a nearly uniform level throughout the sensor structure. This makes the MR regions more immune to fracturing into multiple domains and increases the likelihood that the MR strips will reset into a single domain of they are disturbed by an external magnetic field. With the addition of the permanent magnet strips, the barberpoles serve another purpose. Not only do they reorient the current at 45° with respect to the magnetization vector M, but they also form a current bridge to carry the current from one magnetoresistive region over the permanent magnet strip, to the next magnetoresistive region. The permanent magnet strips also prevent the sense current from flowing into undesirable areas of the MR regions.

Although the present invention has been described with reference to preferred embodiments, workers skilled in the art will recognize that changes may be made in form and detail without departing from then spirit and scope of the invention.

What is claimed is:

1. A magnetoresistive sensor for sensing magnetic fields based on a sensing current conducted therethrough, comprising:

three spaced apart magnetoresistive regions so disposed and arranged that magnetoresistive material forms no conduction paths between the magnetoresistive regions, the regions exhibiting a magnetization in the presence of magnetic fields;

a plurality of conductive strips, with each conductive strip electrically connecting two of the magnetoresistive regions to define a conduction path for the sensing current; and a plurality of permanent magnet strips, with each permanent magnet strip positioned between two of the magnetoresistive regions for biasing the magnetization toward a predetermined angle relative the conduction path, wherein the plurality of permanent magnet strips are formed at least partially within a plan of the three spaced apart magnetoresistive regions, such that the conductive strips each respectively overlie and bridge across respective permanent magnet such that the conductive strips conduct current from one magnetoresistive region to the next.

2. The sensor of claim 1 wherein each conductive strip is canted to conduct current at 45 degrees relative to the magnetization of the sensor.

3. The sensor of claim 2 wherein each permanent magnet strip has a center, each conductive strip has a center, and each magnet strip is disposed normal to a length of the sensor with the center of each permanent magnet strip aligned with the center of each conductive strip so that each conductive strip is canted across a magnet strip at 45 degrees.

4. The sensor of claim 1 wherein the plurality of permanent magnet strips are formed from a material having a higher resistivity than the material from which the magnetoresistive regions are formed.

5. The sensor of claim 1 and further comprising:
a first conductive contact electrically coupled to one of the magnetoresistive regions; and
a second conductive contact electrically coupled to another of the magnetoresistive regions.

6. The sensor of claim 5 wherein the first and second conductive contacts are canted at 45 degrees.

7. The sensor of claim 5 wherein the first and second conductive contacts and the conductive strips are formed from a material having a lower resistivity than the material from which the magnetoresistive regions are formed.

8. The sensor of claim 1 wherein gaps separate each permanent magnet strip from adjacent magnetoresistive regions.

9. The sensor of claim 1 wherein each permanent magnet strip is separated from adjacent magnetoresistive regions by electrical insulation.

10. A method of making a magnetoresistive sensor, the method comprising:
forming a plurality of separated magnetoresistive members upon a substrate;
forming a plurality of permanent magnets upon the substrate, such that at least one permanent magnet is positioned between two of the magnetoresistive members; and
forming a plurality of conductive members, with each conductive member contacting at least one magnetoresistive member and with at least one conductive member contacting two magnetoresistive members, wherein the plurality of permanent magnets are formed at least partially within a plane of the separated magnetoresistive members, such that the at least one conductive members overlies and bridges across the respective permanent magnet to conductive current between the two respective magnetoresistive members.

11. The method of claim 10 further comprising:
forming a layer of electrical insulation on the permanent magnets, before forming the conductive members.

12. The method of claim 10 wherein forming the plurality of permanent magnets includes: forming respective first and second permanent magnets on the substrate adjacent two of the magnetoresistive members.

13. The method of claim 10 wherein the magnetoresistive members are formed from $Ni_{82}Fe_{18}$.

14. The method of claim 10 wherein each permanent magnet is separated from adjacent magnetoresistive members.

15. The method of claim 10 wherein forming the plurality of conductive members includes:
forming respective first and second conductive members on two of the magnetoresistive members.

16. A magnetoresistive sensor, comprising:
first and second separated magnetoresistive members having respective first and second facing surfaces and exhibiting a magnetization in the presence of magnetic fields;
a first conductive bridge electrically connecting the first and second magnetoresistive members to define an electrical conduction path; and
a first permanent magnet fixed relative the first and second magnetoresistive members and at least partially between the facing surfaces, to enhance magnetic fields between the first and second surfaces for biasing the magnetization toward a predetermined angle relative to the electrical conduction path, wherein the conductive bridge overlies and bridge across the first permanent magnet such that the first conductive bridge conducts current between the first and second magnetoresistive members.

17. The sensor of claim 16 wherein the predetermined angle is substantially 45 degrees, further comprising:
first and second electrical contacts electrically coupled to the respective first and second magnetoresistive members.

18. The sensor of claim 16 wherein the first magnetoresistive member has a third surface opposite the first surface, the sensor further comprising:
a second permanent magnet positioned adjacent the third surface of the first magnetoresistive member for magnetically biasing the first magnetoresistive member at the predetermined angle relative to the electrical conduction path, the second permanent magnet having a fourth surface facing the third surface of the first magnetoresistive member.

19. The sensor of claim 18 further including:
a third magnetoresistive member separated from the first magnetoresistive member and having a fifth surface and exhibiting a magnetization in the presence of magnetic fields;
a second conductive bridge electrically connecting the first and third magnetoresistive members to extend the electrical conduction path; and
first and second electrical contacts respectively coupled to the second and third magnetoresistive members, the second permanent magnet being fixed relative to the first and third magnetoresistive members and between the third and fifth surfaces to enchance magnetic fields between the third and fifth surfaces for biasing magnetization to the predetermined angle relative to the electrical conductive path, wherein the second conductive bridge overlies and bridges across the second permanent magnet such that the second conductive bridge conducts current between the first and third magnetoresistive member.

* * * * *